United States Patent
Zhang et al.

(10) Patent No.: US 11,150,211 B2
(45) Date of Patent: Oct. 19, 2021

(54) METHOD FOR PREPARING GRAPHENE MODIFIED COMPOSITE PLANAR PH SENSOR

(71) Applicant: Jiangsu University, Jiangsu (CN)

(72) Inventors: Xiliang Zhang, Jiangsu (CN); Kun Xu, Jiangsu (CN); Shoujuan Cui, Jiangsu (CN); Miaomiao Geng, Jiangsu (CN); Pingping Li, Jiangsu (CN); Shiqing Zhang, Jiangsu (CN)

(73) Assignee: Jiangsu University, Jiangsu (CN)

( * ) Notice: Subject to any disclaimer, the term of this patent is extended or adjusted under 35 U.S.C. 154(b) by 361 days.

(21) Appl. No.: 15/768,185

(22) PCT Filed: May 19, 2016

(86) PCT No.: PCT/CN2016/082578
§ 371 (c)(1),
(2) Date: Apr. 13, 2018

(87) PCT Pub. No.: WO2017/193415
PCT Pub. Date: Nov. 16, 2017

(65) Prior Publication Data
US 2018/0321174 A1    Nov. 8, 2018

(30) Foreign Application Priority Data

May 9, 2016    (CN) .......................... 201610301182.5

(51) Int. Cl.
*G01N 27/30*    (2006.01)
*C23C 28/00*    (2006.01)
(Continued)

(52) U.S. Cl.
CPC ........... *G01N 27/302* (2013.01); *C23C 14/08* (2013.01); *C23C 14/185* (2013.01);
(Continued)

(58) Field of Classification Search
CPC .... G01N 27/301; G01N 27/302; C23C 14/08; C23C 14/185; C23C 14/5846; C23C 28/00; C23C 28/32
(Continued)

(56) References Cited

U.S. PATENT DOCUMENTS 6,939,640 B2    9/2005    Kourtakis
7,754,928 B2    7/2010    Manzer
(Continued)

FOREIGN PATENT DOCUMENTS

CN    101236170 A    8/2008
CN    102565164 A    7/2012
(Continued)

OTHER PUBLICATIONS

Poly(Perfluorosulfonic Acid) Membranes, M Yandrasits and S Hamrock, 3M Fuel Cell Components Program, St. Paul, Mn, usa, © 2012 Elsevier B.V. All rights reserved. (Year: 2012).*
(Continued)

*Primary Examiner* — Rodney G McDonald
(74) *Attorney, Agent, or Firm* — Greenberg Traurig, LLP

(57) ABSTRACT

Provided is a fabrication method for a composite planar pH sensor modified by graphene film including: slotting into substrate, setting copper foil on both sides, and setting leads on the copper foil; coating graphene film on the copper foils using micro mechanical stripping method to form the first graphene film and the second graphene film; depositing Sb layer and $Sb_2O_3$ layer successively on the first graphene film by magnetron sputtering method, and coating Nafion™ perfluorinated sulfonic acid membrane on the $Sb_2O_3$ layer by spin-coating method to fabricate pH working electrode; depositing Ag layer on the second graphene film and dipping in $FeCl_3$ solution to form AgCl layer; coating the third graphene film on the AgCl layer to fabricate reference
(Continued)

electrode. The composite planar pH sensor modified by graphene film may be used in pH measurement for solid, semisolid, mash and solution samples.

7 Claims, 1 Drawing Sheet

(51) Int. Cl.
  *C23C 14/58*    (2006.01)
  *C23C 14/08*    (2006.01)
  *C23C 14/18*    (2006.01)
  *C23C 14/35*    (2006.01)

(52) U.S. Cl.
  CPC ........ *C23C 14/354* (2013.01); *C23C 14/5846* (2013.01); *C23C 28/00* (2013.01); *C23C 28/32* (2013.01); *G01N 27/301* (2013.01)

(58) Field of Classification Search
  USPC .................................................. 204/192.15
  See application file for complete search history.

(56) References Cited

U.S. PATENT DOCUMENTS

| | | |
|---|---|---|
| 8,932,782 B2 | 1/2015 | Sahu et al. |
| 2011/0041980 A1 | 2/2011 | Kim |

FOREIGN PATENT DOCUMENTS

| | | |
|---|---|---|
| CN | 104007158 A | 8/2014 |
| CN | 105449106 A | 3/2016 |
| KR | 20140127475 A | 11/2014 |

OTHER PUBLICATIONS

Glanc-Gostkiewicz et al., "Performance of miniaturised thick-film solid state pH sensors," Sensors and Actuators A: Physical 202:2-7 (2013).

Lu et al., "Preparation of a Kind of All-solid-state pH Sensor," Journal Qingdao University of Science and Technology (Natural Science Edition), 33(1):29-32 (2012).

Manjakkal et al., "Fabrication of thick film sensitive $RuO_2$—$TiO_2$ and Ag/AgCl/KCl reference electrodes and their application for pH measurements," Sensor and Actuators B 204:57-67 (2014).

Maurya et al., "High-sensitivity pH sensor employing a sub-micron ruthenium oxide thin-film in conjunction with a thick reference electrode," Sensors and Actuators A 203:300-303 (2013).

International Search Report from International Application No. PCT/CN2016/082578 dated Dec. 29, 2016, two (2) pages.

\* cited by examiner

METHOD FOR PREPARING GRAPHENE MODIFIED COMPOSITE PLANAR PH SENSOR

CROSS REFERENCE TO RELATED APPLICATIONS

The present application is a 371 U.S. National Stage of International Application No. PCT/CN2016/082578, filed May 19, 2016, entitled "METHOD FOR PREPARING GRAPHENE MODIFIED COMPOSITE PLANAR PH SENSOR" which in turn claims priority to Chinese Application 201610301182.5 with the same title filed May 9, 2016, both of which are incorporated herein by reference in their entirety.

TECHNICAL FIELD

The presented invention belongs to the domain of chemical sensor fabrication. The invention relates to fabricated method of a composite planar pH sensor modified by graphene film.

BACKGROUND OF RELATED ART pH is one of the most important chemical parameter in industrial and agricultural process, and has received more and more attentions by many groups around the world. Recently, the study of pH measurement consists of electrochemical measurement and nonelectrochemical measurement. The electrochemical measurement method is the most widely used technique for pH determination, and has many merits compared to the nonelectrochemical measurement, such as fast, portable, low cost, and so on.

The typical electrochemical pH measurement consists of reference electrode and working electrode. Considering the need of microminiaturization and intellectualization of pH sensor, composite pH sensor with high performance has been research focus to realize the pH measurement in situ. Currently, the study on fabrication method of composite pH sensor is proceed by many specialists. For example, Lv Guangmei et al proposed $Sb/Sb_2O_3$ pH electrode by immersion coating process, new all-solid-stated reference electrode by wafer method, and then fabricated a all-solid-stated composite $Sb/Sb_2O_3$ pH sensor. The sensor can work under great pressure and used for pH on-line measurement in deep ground water. D. K. Maurya et al presented a low-cost, rugged, miniaturized ruthenium oxide ($RuO_2$) thin-film pH sensor comprising a $RuO_2$ on platinum sensing electrode deposited using R.F. magnetron sputtered in conjunction with an integrated thick Ag/AgCl reference electrode, and the sensor was in excellent agreement with the theoretical Nernstian response. M. Glanc-Gostkiewicz et al reported a novel solid state thick-film pH sensor for water quality sampling which was designed for deployment in remote catchment areas. The sensor employed a screen printed metal oxide ($RuO_2$) ion selective electrode used in combination with a screen printed Ag/AgCl reference electrode. Libu Manjakkal et al investigated thick film potentiometric and conductimetric sensors based on mixed metal oxides $RuO_2$ and $TiO_2$ employing screen printing method on alumina substrate. The sensor was low cost and simple fabrication. However, these publications are all for pH measurement in solution conditions, and the study on pH sensor for solid-liquid mixture is scarce.

Chinese patent numbered CN104007158 (A) disclosed an integrated planar all-solid-stated pH electrochemical sensor based on nano tungsten oxide. However, the sensor has many drawbacks, such as low accuracy, slow response, and poor adaptability especially in solid-liquid mixture and mash conditions. Chinese patents numbered CN 101236170 (A) disclosed an all-solid-stated composite pH electrode and its fabrication method. The composite pH electrode has many advantages, such as good mechanical properties, easy insertion, and good anti-interference, and can be used in semi-solid and mash conditions, as well as in solution condition. But the fabrication method is extensive, so it has bad reproducibility. Also because of the material's week inductive, the electrical conductivity of the electrode is poor.

SUMMARY

Purpose of this invention: aimed to eliminate the defects of pH sensor for soil, cultivated substrate with certain humility. Fabrication of a composite planar pH sensor modified by graphene film is proposed to measure pH in complex conditions precisely and quickly.

The main contents of this invention are as follows:

The technical scheme of the fabrication method of a composite planar pH sensor modified by graphene film is described below:

S1. Preparation of the substrate: slotting on the two sides of the substrate, then setting the first copper foil and the second copper foil on the bottom of the slots respectively; preparation leads on the first copper foil and the second copper foil by printing process respectively in the substrate;

S2. Preparation of the pH working electrode: coating with the first graphene film on the first copper foil using micro mechanical stripping method; depositing the Sb layer on the first graphene film by magnetron sputtering method; depositing the $Sb_2O_3$ layer on the surface of the Sb layer by magnetron sputtering method; coating with Nafion™ perfluorinated sulfonic acid membrane on the surface of the $Sb_2O_3$ layer by spin-coating method; the pH working electrode is consist of the first graphene film, the Sb layer, the $Sb_2O_3$ layer, and the Nafion™ perfluorinated sulfonic acid membrane, in which the first graphene film and the first copper foil are electrical connected each other.

S3. Preparation of the reference electrode: coating with the second graphene film on the second copper foil using micro mechanical stripping method; depositing the Ag layer on the second graphene film by magnetron sputtering method; dipping in $FeCl_3$ solution to form AgCl layer, and the transformation is incomplete; coating with the third graphene film on the AgCl layer using micro mechanical stripping method; the second graphene film, the Ag layer, the AgCl layer, and the third graphene film consist of the reference electrode.

The details of fabrication of the said Sb layer as follows: the method is RF magnetron sputtering, the target material is antimony, and the gas is argon; the sputtering is completed at room temperature, the time is 40~50 min, the flow is 39 sccm, the vacuum is 3□10-4 Pa, the power is 65 W, and the process pressure is 1 Pa.

The details of fabrication of the said $Sb_2O_3$ layer as follows: the target material is antimony, and the gas is argon, also the oxygen gas is added, the concentration ratio of argon and oxygen is 8:2, and the deposition time is 50 min.

The details of fabrication of the said Ag layer as follows: the method is RF magnetron sputtering, the target material is silver, and the shielding gas is argon; the sputtering is completed at room temperature, the time is 20~30 min, the flow is 30 sccm, the vacuum is 3□10-4 Pa, the power is 18 W, and the process pressure is 1 Pa.

The concentration of the said ferric chloride solution is 0.1 mol/L, and the soak time is 30 s.

The thickness of the said Sb layer is 230~250 nm, the Sb2O3 layer (12) 40~60 nm, and the Nafion™ perfluorinated sulfonic acid layer (11) 1.5~1.9 µm.

The thickness of the said Ag layer is 140~160 nm, the said AgCl layer 15~25 nm, and the said Ag layer are not covered with the said AgCl layer completely.

By means of this fabrication method, the performance of the pH sensor will be improved in many indexes.

The graphene has many excellent electrical properties, especially the conductivity. In this invention, the graphene is selected as conductive material, so the response time of the pH sensor will be decreased obviously. As to reference electrode, the graphene is determined as modification, which can make the electrode isolation from the interference ions and electron conduction with test samples, so the sensitivity of the pH sensor will be improved. As to the working electrode, the antimony and antimony oxide are determined as sensing material, and Nafion™ perfluorinated sulfonic acid is used for modification, the anti-interference will be improved.

In these figures, 1 is the working electrode, 2 is the first copper foil, 3 is the leads, 4 is the substrate, 5 is the second copper foil, 6 is the reference electrode, 11 is the Nafion™ perfluorinated sulfonic acid membrane, 12 is the Sb2O3 layer, 13 is the Sb layer, 14 is the first graphene film, 61 is the second graphene film, 62 is the Ag layer, 63 is the AgCl layer, 64 is the third graphene film.

DETAILED DESCRIPTION

Further description of this invention is presented combined with the drawings, but this invention is not limited to this disclosed description.

Figure 1:
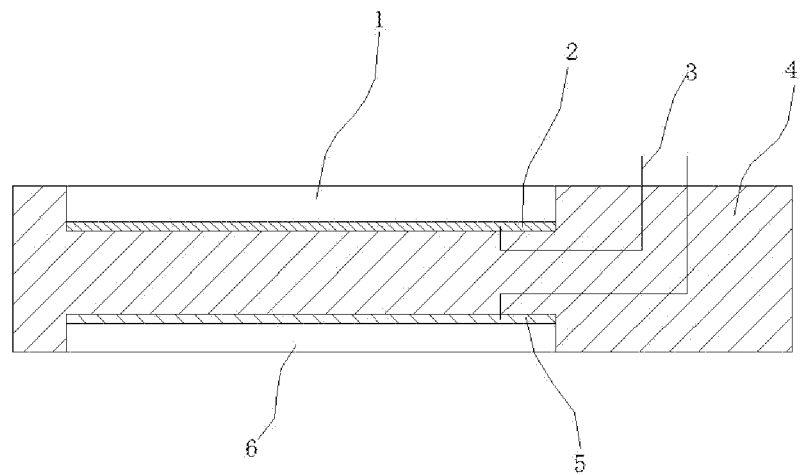
FIG. 1 is a schematic of the composite planar pH sensor modified by graphene film.

Said composite planar pH sensor modified by graphene film consists of working electrode 1, reference electrode 6 and substrate 4, as shown in FIG. 1.

Figure 2:
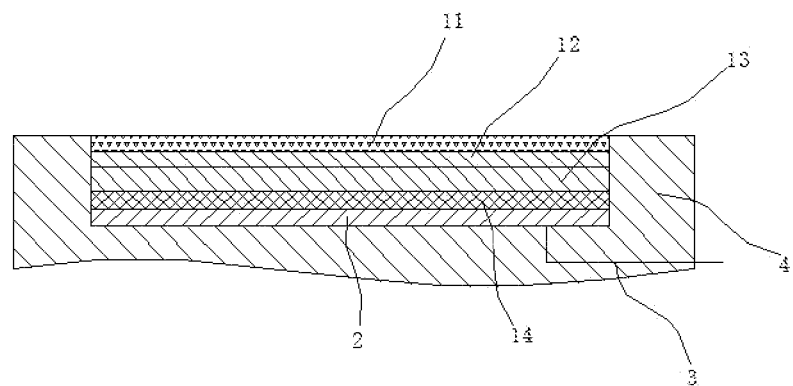
FIG. 2 is a schematic of the working electrode.

As shown in FIG. 2, said working electrode 1 and the first copper foil 2 are electrical connected each other with the help of the first graphene film 14.

Sb layer 13 and Sb2O3 layer 12 are deposited on the top of the first graphene film 14, and then Nafion™ perfluorinated sulfonic acid membrane is coating on the surface of the Sb2O3 layer 12.

Figure 3:
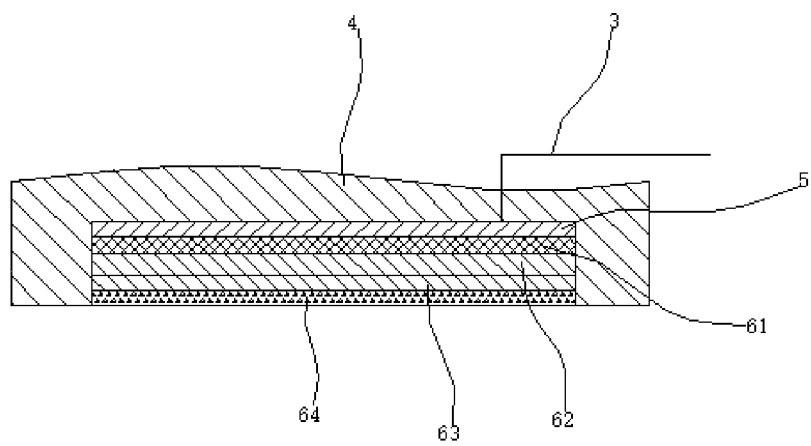
FIG. 3 is a schematic of the reference electrode.

As shown in FIG. 3, said reference electrode 6 consists of the second graphene film 61, the Ag layer 62, the AgCl layer 63, and the third graphene film 64. The second graphene film 61 is deposited on the surface of the second copper foil 62; on the surface of the second graphene film 61, the Ag layer 62, the AgCl layer 63, and the third graphene film 64 are deposited in sequence.

Said the fabrication method of a composite planar pH sensor modified by graphene film is described below:

Preparation of the substrate 4: slotting on the two sides of the substrate 4, then setting the first copper foil 2 and the second copper foil 5 on the bottom of the slots respectively; preparation leads 3 on the first copper foil 2 and the second copper foil 5 by printing process respectively in the substrate 4; Preparation of the pH working electrode 1: coating with the first graphene film 14 on the first copper foil 2 using micro mechanical stripping method; depositing the Sb layer 13 on the first graphene film 14 by magnetron sputtering method; depositing the Sb2O3 layer 12 on the surface of the Sb layer 13 by magnetron sputtering method; coating with Nafion™ perfluorinated sulfonic acid membrane 11 on the surface of the Sb2O3 layer 12 by spin-coating method; the pH working electrode 1 is consist of the first graphene film 14, the Sb layer 13, the Sb2O3 layer 12, and the Nafion™ perfluorinated sulfonic acid membrane 11, in which the first graphene film 14 and the first copper foil 2 are electrical connected each other. The thickness of the Sb layer 13 is 240 nm, the Sb2O3 layer 12~50 nm, the Nafion™ perfluorinated sulfonic acid membrane 1.7 µm.

Preparation of the reference electrode 6: coating with the second graphene film 61 on the second copper foil 2 using micro mechanical stripping method; depositing the Ag layer 62 on the second graphene film 61 by magnetron sputtering method; dipping in FeCl3 solution to form AgCl layer 63, and the transformation is incomplete; coating with the third graphene film 64 on the AgCl layer 63 using micro mechanical stripping method; the second graphene film 61, the Ag layer 62, the AgCl layer 63, and the third graphene film 64 consist of the reference electrode 6. The thickness of the Ag layer 62 is ~150 nm, the thickness of the AgCl layer 63 is ~15 nm, and the Ag layer 62 is not covered with AgCl layer 63 completely.

Preferred Embodiment 1

The following describes a preferred embodiment of this method and device with composite planar pH sensor modified by graphene film as an example.

Step 1. Preparation of the substrate 4: slotting on the two sides of the substrate 4, then setting the first copper foil 2 and the second copper foil 5 on the bottom of the slots respectively; preparation leads 3 on the first copper foil 2 and the second copper foil 5 by printing process respectively in the substrate 4.

Step 2. Preparation of the pH working electrode 1: coating with the first graphene film 14 on the first copper foil 2 using micro mechanical stripping method; depositing the Sb layer 13 on the first graphene film 14 by magnetron sputtering method, the target material is antimony, and the gas is argon; the sputtering is completed at room temperature, the time is 40-50 min, the flow is 39 sccm, the vacuum is $3 \times 10^4$ Pa, the power is 65 W, and the process pressure is 1 Pa, the thickness of the Sb layer 13 is 240 nm; depositing the Sb2O3 layer 12 on the surface of the Sb layer 13 by magnetron sputtering method, the target material is antimony, and the gas is argon, also the oxygen gas is added, the concentration ratio of argon and oxygen is 8:2, and the deposition time is 50 min, the thickness of Sb2O3 layer 12 is −50 nm; coating with Nafion™ perfluorinated sulfonic acid membrane 11 on the surface of the Sb2O3 layer 12 by spin-coating method, the thickness of the Nafion™ perfluorinated sulfonic acid membrane is 1.7 µm.

Step 3. Preparation of the reference electrode 6: coating with the second graphene film 61 on the second copper foil 2 using micro mechanical stripping method; depositing the Ag layer 62 on the second graphene film 61 by magnetron sputtering method, the target material is silver, and the gas is argon; the sputtering is completed at room temperature, the time is 20~30 min, the flow is 30 sccm, the vacuum is $3 \times 10^{-4}$ Pa, the power is 18 W, and the process pressure is 1 Pa, the thickness of the Ag layer 62 is 150 nm; dipping in FeCl3 solution to form AgCl layer 63, and the transformation is incomplete, the concentration of the used ferric chloride solution is 0.1 mol/L, and the soak time is 30 s, and the thickness of the AgCl layer 63 is 15 nm; coating with the third graphene film 64 on the AgCl layer 63 using micro mechanical stripping method.

This preferred embodiment is the optimal implementation scheme, but this invention is not limited to this disclosed implementation scheme. The protection scope of this invention includes any obvious improvements, replaces or variations by technical staff of this area.

We claim:

1. A fabrication method of a composite planar pH sensor modified by graphene film including the steps of:
    preparing a substrate including
        forming a slot on each of two sides of the substrate,
        setting a first copper foil and a second copper foil on a bottom of the slots respectively; and
        preparing leads on the first copper foil and the second copper foil by a printing process respectively in the substrate;
    preparing a pH working electrode including
        coating with a first graphene film on the first copper foil using a micro mechanical stripping method;
        depositing a Sb layer on the first graphene film by a magnetron sputtering method;
        depositing a $Sb_2O_3$ layer on a surface of the Sb layer by a magnetron sputtering method;
        coating with a membrane layer on a surface of the $Sb_2O_3$ layer by a spin-coating method; wherein the pH working electrode comprises:
            the first graphene film,
            the Sb layer,
            the $Sb_2O_3$ layer, and
            the membrane layer,
            wherein the first graphene film and the first copper foil are electrically connected to each other,
    preparing a reference electrode including
        coating with a second graphene film on a second copper foil using a micro mechanical stripping method;
        depositing a Ag layer on the second graphene film by a magnetron sputtering method;
            dipping in a $FeCl_3$ solution to form a AgCl layer;
        coating with a third graphene film on the AgCl layer using a micro mechanical stripping method;
    wherein the second graphene film, the Ag layer, the AgCl layer, and the third graphene film together comprise the reference electrode.

2. The fabrication method of a composite planar pH sensor modified by graphene film according to claim 1, wherein, the depositing of the Sb layer is as follows: the magnetron sputtering method of depositing the Sb layer is RF magnetron sputtering, a target material is antimony, and a gas used is argon; the magnetron sputtering method of depositing the Sb layer is completed at room temperature, an RF magnetron sputtering time is 40~50 min, an argon flow is 39 sccm, a vacuum is $3 \times 10^{-4}$ Pa, a power is 65 W, and a process pressure is 1 Pa.

3. The fabrication method of a composite planar pH sensor modified by graphene film according to claim 1, wherein, the depositing of the $Sb_2O_3$ layer is as follows: a target material is antimony, and a gas is argon, and oxygen gas is added, the concentration ratio of argon and oxygen is 8:2, and a deposition time is 50 min.

4. The fabrication method of a composite planar pH sensor modified by graphene film according to claim 1, wherein, the depositing of the Ag layer is as follows: the magnetron sputtering method of depositing the Ag layer is RF magnetron sputtering, a target material is silver, and a gas is argon; the RF magnetron sputtering is completed at room temperature, a time is 20~30 min, an argon flow is 30 sccm, a vacuum is $3 \times 10^{-4}$ Pa, a power is 18 W, and a process pressure is 1 Pa.

5. The fabrication method of a composite planar pH sensor modified by graphene film according to claim 1, wherein, a concentration of a used ferric chloride solution is 0.1 mol/L, and a soak time is 30 s.

6. The fabrication method of a composite planar pH sensor modified by graphene film according to claim 1, wherein, a thickness of the Sb layer is 230~250 nm, the $Sb_2O_3$ layer 40~60 nm, and the membrane layer 1.5~1.9 μm.

7. The fabrication method of a composite planar pH sensor modified by graphene film according to claim 1, wherein, a thickness of the Ag layer is 140~160 nm, the AgCl layer 15~25 nm, and the Ag layer is not covered with AgCl layer completely.

\* \* \* \* \*